United States Patent [19]
Zhang et al.

[11] Patent Number: 5,594,750
[45] Date of Patent: Jan. 14, 1997

[54] SELECTIVELY SI-DOPED INAS/A1ASSB SHORT-PERIOD-SUPERLATTICES AS N-TYPE CLADDING LAYERS FOR MID-IR LASER STRUCTURES GROWN ON INAS SUBSTRATES

[75] Inventors: Yong H. Zhang, Westlake Village; David H. Chow, Newbury Park, both of Calif.

[73] Assignee: Hughes Aircraft Company, Los Angeles, Calif.

[21] Appl. No.: 468,179

[22] Filed: Jun. 6, 1995

[51] Int. Cl.$^6$ .............................. H01S 3/19; H01L 29/15
[52] U.S. Cl. .................. 372/45; 257/14; 257/15
[58] Field of Search ..................... 372/45, 44, 43; 257/14, 15

[56] References Cited

U.S. PATENT DOCUMENTS

| | | | |
|---|---|---|---|
| 5,268,582 | 12/1993 | Kopf et al. | 257/15 |
| 5,481,397 | 1/1996 | Burt | 257/14 X |
| 5,506,418 | 4/1996 | Bois et al. | 257/15 |

OTHER PUBLICATIONS

H. K. Choi et al, "3.9–μm InAsSb/AlAs$_{0.16}$Sb double–heterostructure diode lasers with high output power and improved temperature characteristics", Applied Physics Letters, vol. 65, pp. 2251–2253 (31 Oct. 1994).
S. J. Eglash et al, "MBE growth of GaInAsSb/AlGaAsSb double heterostructures for infrared diode lasers", Journal of Crystal Growth, vol. 111, pp. 669–676 (1991) No month.
S. J. Eglash et al, "InAsSb/AlAsSb double–heterostructure diode lasers emitting at 4 μm", Applied Physics Letters, vol. 64, No. 7, pp. 833–835 (14 Feb. 1994).
S. Adachi, "GaAs,AlAs, and Al$_x$Ga$_{1-x}$As: Material parameters for use in research and device applications", Journal of Applied Physics, vol. 58, pp. R1–R29 (1985) No month.
A. Y. Cho et al, "Epitaxy of Silicon Doped Gallium Arsenide by Molecular Beam Method", Metallurgical Transactions, vol. 2, pp. 777–780 (Mar. 1971).
B. O. Seraphin et al, "Optical Constants" in *Semiconductor and Semimetals*, vol. 3 (Optical Properties of III–V Compounds), R. K. Willardson and A. C. Beer, Editors, Academic Press, N.Y., pp. 499, 532–536 (1967) No month.
H. K. Choi et al, "High–power multiple–quantum–well GaInAsSb/AlGaAsSb diode lasers emitting at 2.1 μm with low threshold current density", Applied Physics Letters, vol. 61, No. 10, pp. 1154–1156 (7 Sep. 1992).

*Primary Examiner*—James W. Davie
*Attorney, Agent, or Firm*—V. D. Duraiswamy; W. K. Denson-Low

[57] ABSTRACT

A MWIR laser is provided having a novel n-type superlattice cladding layer comprising either InAs/AlAs$_{0.16}$Sb$_{0.84}$ or In$_x$Ga$_y$Al$_{1-x-y}$As/AlSb. The n-type superlattice cladding layer may comprise a Si selectively-doped (SD) InAs/AlAs$_{0.16}$Sb$_{0.84}$ short-period superlattice (SPS) lattice-matched to an InAs substrate or a Si SD In$_x$Ga$_y$Al$_{1-x-y}$As/AlSb SPS lattice-matched to a GaSb or InAs substrate. The advantages of the Si SD InAs/AlAs$_{0.16}$Sb$_{0.84}$ SPS and Si SD In$_x$Ga$_y$Al$_{1-x-y}$As/AlSb SPS include: (1) large dynamic range in the electron concentration in the Si-doped n-type cladding layer; and (2) strong hole confinement in the active region. Furthermore, the novel n-type superlattice cladding layer can be deposited without the use of tellurium (Te) which is not a preferred source material for MBE growth of III-V semiconductors.

18 Claims, 3 Drawing Sheets

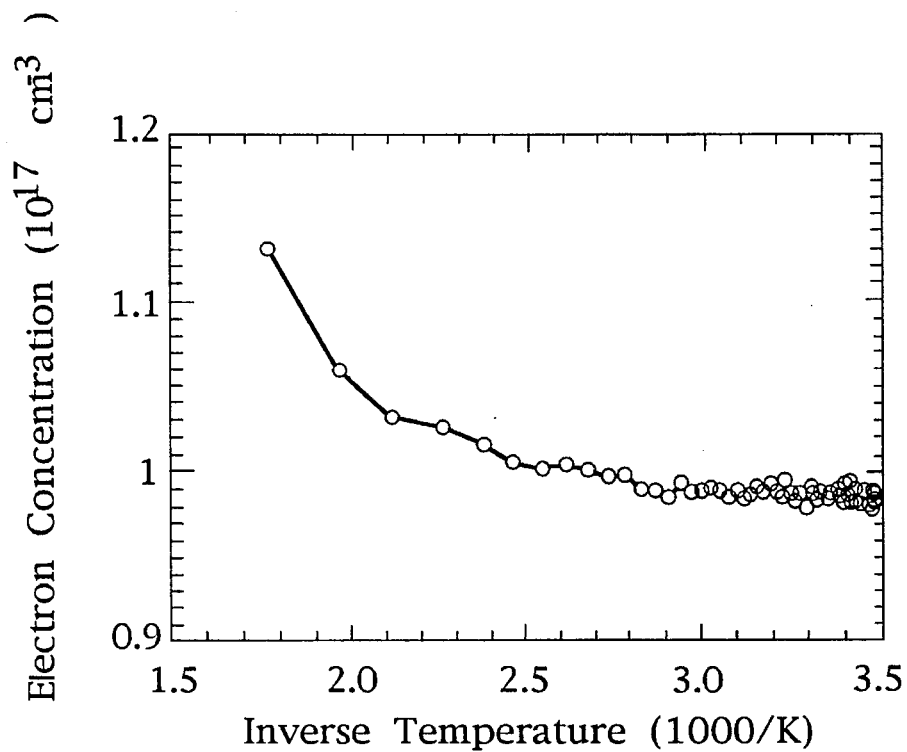
FIG. 2.
FIG. 3.
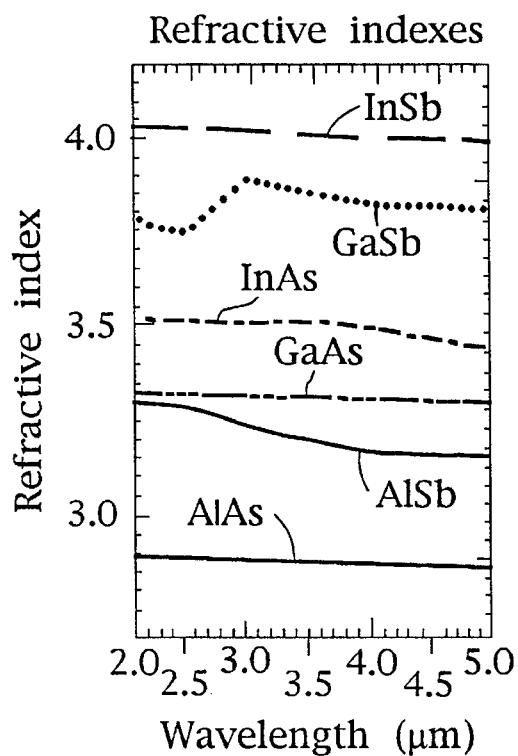

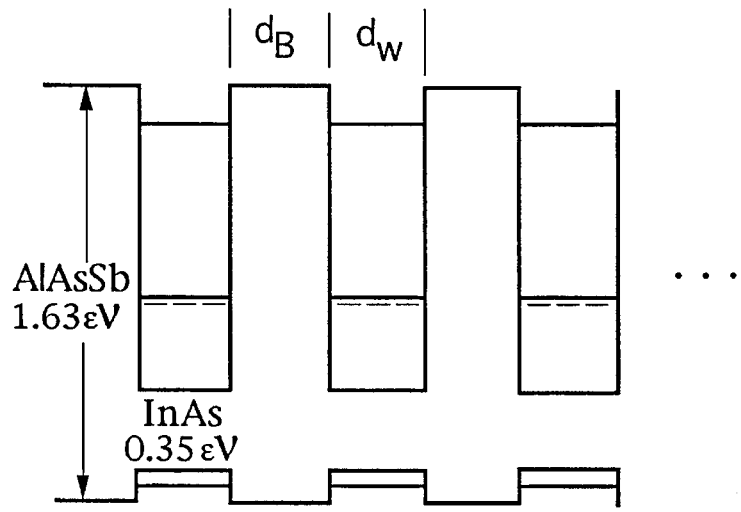
FIG. 4.
FIG. 5.
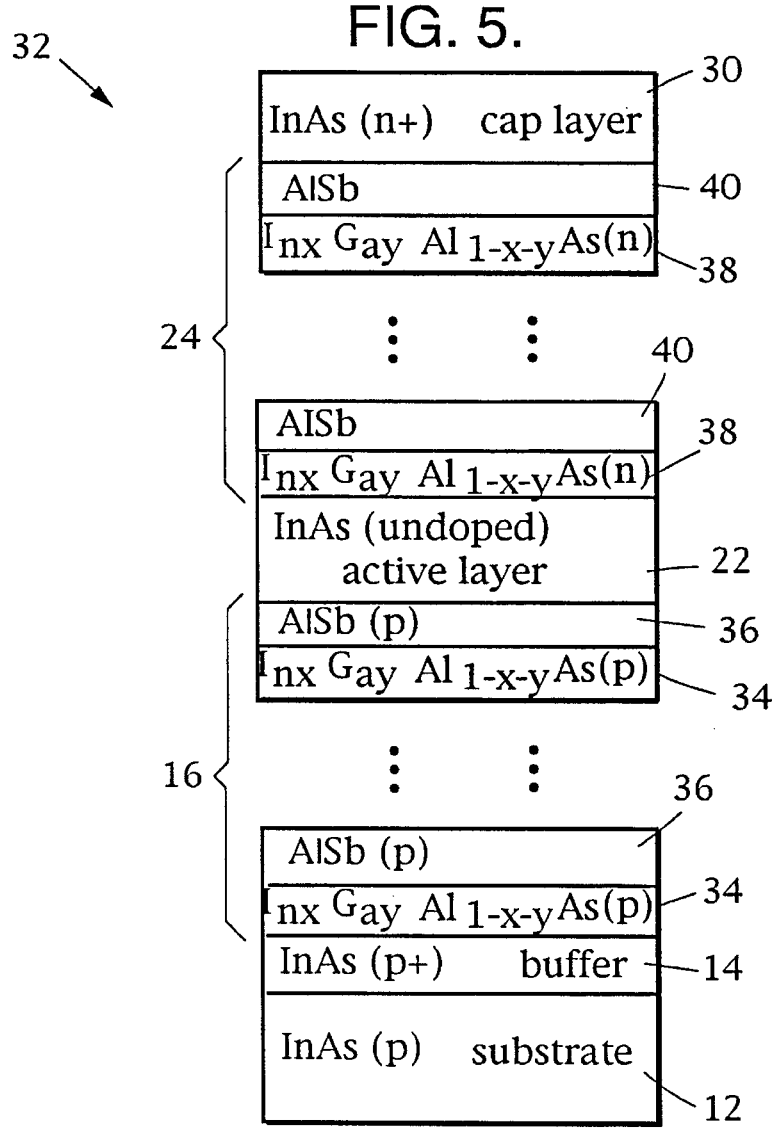

SELECTIVELY SI-DOPED INAS/A1ASSB SHORT-PERIOD-SUPERLATTICES AS N-TYPE CLADDING LAYERS FOR MID-IR LASER STRUCTURES GROWN ON INAS SUBSTRATES

BACKGROUND OF THE INVENTION

1. Field of the Invention

The present invention is directed to mid-infrared (mid-IR) lasers, that is, lasers operating in the region of about 2 to 5 µm. More particularly, the present invention is directed to n-type cladding layers which efficiently confine holes in such lasers.

2. Description of Related Art

The most promising materials for the fabrication of mid-IR lasers, (or mid-wave infrared lasers) are antimony-containing III-V semiconductors and their alloys, see, e.g., H. K. Choi et al, "3.9-µm InAsSb/AlAsSb double-heterostructure diode lasers with high output power and improved temperature characteristics", *Applied Physics Letters,* Vol. 65, No. 18, pp. 2251–2253 (31 Oct. 1994). As such, present state of the art mid-wave infrared (MWIR) lasers are based on GaInAsSb/AlGaAsSb quaternary materials, see, e.g., S. J. Eglash et al, "MBE growth of GaInAsSb/AlGaAsSb double heterostructures for infrared diode lasers", *Journal of Crystal Growth,* Vol. 111, pp. 669–676 (1991) and S. J. Eglash et al, "InAsSb/AlAsSb double-heterostructure diode lasers emitting at 4 µm", *Applied Physics Letters,* Vol. 64, No. 7, pp. 833–835 (14 Feb. 1994). Tellurium (Te), which is the best established n-type dopant for antimony-containing III-V semiconductors and their alloys, is required for n-type doping of these GaInAsSb/AlGaAsSb quaternary materials. Typically, MWIR laser diode wafers are grown in molecular beam epitaxy (MBE) systems which are used for the growth of devices requiring high material purity, such as infrared detectors. Due to its high vapor pressure, Te is not a preferred dopant source material in these MBE systems.

One of the most important issues for making these MWIR laser diodes without introducing Te into an MBE system is to find a suitable cladding layer material which can be doped n-type and also provide efficient hole confinement. Two prior art approaches have been proposed for replacing Te with Si (silicon) in n-type cladding layers for MWIR laser diodes, see patent application Ser. No. 08/359,751, filed on Dec. 16, 1994 by Thomas C. Hasenberg et al, entitled "Superlattice Cladding Layers for Mid-Infrared Lasers".

The first approach is to selectively dope (SD) an InAs/AlSb short-period-superlattice (SPS) lattice-matched to GaSb. Experiments have demonstrated that an InAs/AlSb SPS lattice-matched to GaSb is suitable for cladding layers in certain laser structures. Constraints on critical thickness, hole confinement, and optical confinement, however, make this material incompatible with certain active layer (or active region) materials, particularly long wavelength alloys. For example, the InAs/AlSb SPS lattice-matched to GaSb would not provide hole confinement for an InAs active region.

The second approach employs an AlAs/AlSb SPS which can be grown lattice-matched to either InAs or GaSb substrates by changing the AlAs mole fractions. For example, an AlAs/AlSb SPS lattice-matched to an InAs substrate comprises 16% AlAs. An AlAs/AlSb SPS lattice-matched to a GaSb substrate comprises 8% AlAs. As Si is a donor in AlAs and an acceptor in AlSb, n-type doping is achieved by doping the AlAs with Si. Since an AlAs/AlSb SPS lattice-matched to an InAs substrate only comprises 16% AlAs and an AlAs/AlSb SPS lattice-matched to a GaSb substrate only comprises 8% AlAs, only 16% or 8% of the total AlAs/AlSb SPS can actually be doped n-type. In order to obtain the $2\times10^{17}$ cm$^{-3}$ doping level needed for laser structures, the AlAs layers must be Si-doped to at least $1.25\times10^{18}$ cm$^{-3}$ and $2.5\times10^{18}$ cm$^{-3}$ for AlAs/AlSb SPS lattice-matched to InAs and GaSb substrates, respectively. Furthermore, AlAs and AlSb intermixing is expected to be very strong during MBE growth. This intermixing, along with the out-diffusion of the Si dopant atoms from AlAs into the AlSb layers, will increase the required doping levels in the AlAs layers. As the maximum Si-doping level achievable in MBE-grown AlAs is in the low $10^{18}$ cm$^{-3}$ range, n-type doping levels in AlAs/AlSb SPS may be insufficient for certain device applications.

Thus, there remains a need for a MWIR laser diode which avoids most, if not all, of the foregoing problems.

SUMMARY OF THE INVENTION

In accordance with the present invention, a MWIR laser is provided having a novel superlattice cladding layer. In one embodiment, the superlattice cladding layer may comprise a Si selectively-doped InAs/AlAs$_{0.16}$Sb$_{0.84}$ short-period-superlattice lattice-matched to an InAs substrate. In another embodiment, the superlattice cladding layer may comprise a Si selectively-doped In$_x$Ga$_y$Al$_{1-x-y}$As/AlSb short-period-superlattice lattice-matched to a GaSb or InAs substrate.

The advantages of the Si selectively-doped InAs/AlAs$_{0.16}$Sb$_{0.84}$ SPS of the first embodiment relative to prior art approaches include: (1) greater dynamic range in the electron concentration in the Si-doped n-type cladding layer; and (2) improved hole confinement in the active region. The SD In$_x$Ga$_y$Al$_{1-x-y}$As/AlSb SPS of the second embodiment simultaneously provides: (1) hole confinement due to the low-lying valence band edge; (2) large dynamic range for n-type doping; and (3) large optical confinement. All three of these properties are needed for n-type cladding layers.

Table 1 lists a comparison of the two existing approaches described above for replacing Te with Si in n-type cladding layers for MWIR laser diodes, (SD InAs/AlSb SPS lattice-matched to GaSb, and SD AlAs/AlSb SPS lattice-matched to GaSb or InAs) with the two proposed embodiments, (SD InAs/AlAsSb SPS lattice-matched to InAs, and SD In$_x$Ga$_y$Al$_{1-x-y}$As/AlSb SPS lattice-matched to InAs or GaSb) of the present invention. The two existing approaches are described in the above-mentioned patent application Ser. No. 08/359,751.

TABLE 1

COMPARISON BETWEEN DIFFERENT SD SPS FOR N-TYPE CLADDING LAYERS

| Approaches | Hole Confinement | Doping Range | Optical Confinement | Bandgap |
|---|---|---|---|---|
| 1) AlAs/AlSb on GaSb | Yes | Small | Large | Large (1.55 eV) |
| 2) InAs/AlSb on GaSb | Yes for most | Large | Medium | Small (<1.2 eV) |

TABLE 1-continued

COMPARISON BETWEEN DIFFERENT SD SPS
FOR N-TYPE CLADDING LAYERS

| Approaches | Hole Confinement | Doping Range | Optical Confinement | Bandgap |
|---|---|---|---|---|
| 3) InAs/AlAsSb on InAs | structures Yes | Large | Medium | Small (<1.2 eV) |
| 4) InGaAlAs/AlSb | Yes for most structures | Medium | Large | Medium (<1.55) |

BRIEF DESCRIPTION OF THE DRAWINGS

FIG. 2, on coordinates of electron concentration and inverse temperature, is a plot of temperature dependent Hall-effect measurements of a selectively doped InAs:Si/AlAs$_{0.16}$Sb$_{0.84}$ short period superlattice;

FIG. 3, on coordinates of refractive index and wavelength, is a plot of the refractive indices for AlAs, AlSb, GaAs, GaSb, InAs and InSb as a function of wavelength;

FIG. 4 is a schematic band edge diagram of a modulation doped InAs:Si/AlAs$_{0.16}$Sb$_{0.84}$ superlattice lattice-matched to an InAs substrate; and FIG. 5 is a cross-sectional view, depicting another embodiment of the superlattice-clad laser diode of the present invention.

DESCRIPTION OF THE PREFERRED EMBODIMENTS

Figure 1:
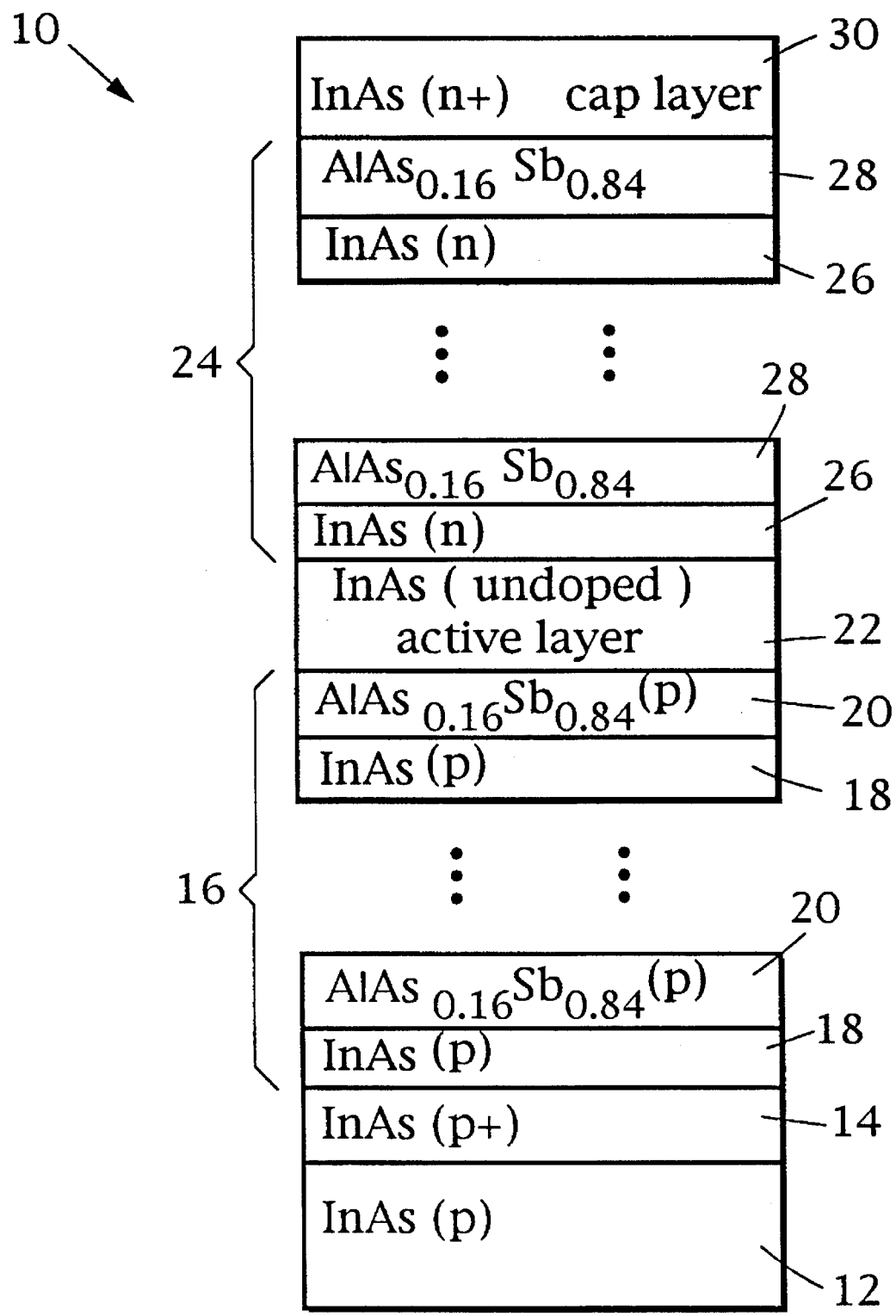
FIG. 1 is a cross-sectional view, depicting one embodiment of the superlattice-clad laser diode of the present invention.

The laser of the present invention operates like any semiconductor laser diode. An active region is sandwiched between n-type and p-type cladding layers. The diode is forward biased and electrons are injected into the active region from the n-type cladding region, while holes are injected from the p-type cladding region. Since the active region has a smaller bandgap than the cladding regions, the electrons and holes are confined in the active regions, and most of them recombine radiatively. The photons generated in the active regions are optically guided, since the index of refraction is higher in the active region than in the cladding layers. Hence, the cladding layers confine the carriers as well as the light to thereby form a waveguide. The present invention is considered unique in that selectively-doped "superlattice" cladding layers are employed. As used herein, the term "superlattice" refers to an alternating structure comprising a plurality of layers of two different semiconductor compounds. Each layer has a thickness typically in the range of about 3 to 100 Å.

A. InAs/AlAs$_{0.16}$Sb$_{0.84}$ Cladding Layers

FIG. 1 depicts one example of the superlattice-clad laser diode of the present invention. In this embodiment, an InAs/AlAs$_{0.16}$Sb$_{0.84}$ superlattice laser structure 10 is formed on a p-doped InAs substrate 12. Note that either n-type or p-type substrates can be used in the InAs/AlAs$_{0.16}$Sb$_{0.84}$ superlattice laser structure 10. A buffer layer 14 comprising p$^+$-doped InAs is formed on the InAs substrate 12, as is conventional in this art. In the case where an n-type substrate is employed, the buffer layer 14 would comprise n$^+$-doped InAs. Next, a first superlattice cladding layer 16 (p-type) comprises alternating layers of p-doped InAs (or p-InAs) 18 and p-doped AlAs$_{0.16}$Sb$_{0.84}$ (or p-AlAs$_{0.16}$Sb$_{0.84}$) 20 and is formed on the buffer layer 14. Note that as an alterative to the alternating layers of p-doped InAs 18 and p-doped AlAs$_{0.16}$Sb$_{0.84}$ 20, the first superlattice cladding layer 16 (p-type) could comprise p-doped AlAsSb (or p-AlAsSb) bulk material. An active region 22, comprising undoped InAs is formed on the first cladding layer 16. The active region material is not limited to undoped InAs but may comprise alternative materials. A second superlattice cladding layer 24 (n-type) comprises alternating layers of n-doped InAs (or n-InAs) 26 and undoped AlAs$_{0.16}$Sb$_{0.84}$ 28 and is formed on the active region 22. A cap layer 30 comprising n$^+$-doped InAs is formed on top of the second superlattice cladding layer 24, completing the InAs/AlAs$_{0.16}$Sb$_{0.84}$ superlattice laser structure 10.

In the case where an n-type substrate is employed, the cladding layer sequence needs to be reversed. The n-type superlattice cladding layer 24 would be formed on the buffer layer 14 and the p-type superlattice cladding layer 16 would be formed on the active region 22.

The thickness ratio between the layers of InAs (18 and 26) and AlAs$_{0.16}$Sb$_{0.84}$ (20 and 28) can vary over a wide range because each material is lattice-matched to the InAs substrate 12. The layers of p-doped InAs 18 and p-doped AlAs$_{0.16}$Sb$_{0.84}$ are doped with beryllium (Be), while the layers of n-doped InAs 26 are doped with Si. The effective carrier concentration can be varied by changing either the total thickness of the layers of n-doped InAs 26 or the Si doping level. Since the achievable Si doping level in InAs is relatively high (on the order of $5 \times 10^{18}$ cm$^{-3}$), a wide range of electron concentrations are available for device design. For example, an InAs/AlAsSb SPS with equal constituent layer thicknesses would have a maximum electron concentration by Si doping of $2.5 \times 10^{18}$ cm$^{-3}$. Furthermore, if one utilizes the n-type doping scheme for AlAsSb disclosed in the above-mentioned patent application Ser. No. 08/359, 751, then the maximum electron concentration can be further increased.

The results of temperature-dependent Hall-effect measurements of electron concentration and mobility are depicted in FIG. 2. A 1 μm thick SD InAs:Si/AlAsSb SPS consisting of 222 periods of 15 Å InAs:Si and 30 Å AlAsSb ordered alloy was tested. The measured electron concentration is $1.2 \times 10^{17}$ cm$^{-3}$. The measured electron mobility is around 6150 cm$^2$/V-s at room temperature and has a small degree of carrier freezeout at lower temperatures (down to 15K). These findings are evidence that the proposed SD InAs:Si/AlAsSb SPS is suitable for n-type cladding layers for MWIR laser diodes.

For an ideal cladding layer only to have high structural quality and limited non-radiative recombination centers is not sufficient. Two other important factors need also to be taken into account, namely, the refractive index and the valence band edge.

FIG. 3 depicts the bulk refractive indices of AlAs, AlSb, GaAs, GaSb, InAs, and InSb. The curve for AlAs is based on the model given in S. Adachi, "GaAs, AlAs, and $Al_xGa_{1-x}$As: Material parameters for use in research and device applications", *Journal of Applied Physics*, Vol. 58, pp. R1–R29 (1985). The curve for the rest of the alloys are experimental data given in B. O. Seraphin et al, Vol. 3 "Semiconductors and Semimetals", Ed. by R. K. Willardson et al, Academic Press, N.Y., p. 499 (1967). For alloys comprising these binary materials, it is reasonable to assume that their refractive indices, at energies well below the effective bandgap, are linear interpolations of the associated binaries. From FIG. 3, one can see that the $InAs/AlAs_{0.16}Sb_{0.84}$ has a smaller refractive index than any of the materials which could be used as active regions for MWIR laser structures. These materials include InAs, $In_{0.72}Ga_{0.28}As_{0.73}Sb_{0.27}$ lattice-matched to InAs, or strained $In_xGa_{1-x}As_ySb_{1-y}$. Therefore, effective waveguiding will be provided by the InAs/AlAsSb SPS.

A schematic band edge diagram of a modulation doped $InAs:Si/AlAs_{0.16}Sb_{0.84}$ superlattice lattice-matched to an InAs substrate is shown in FIG. 4. The $InAs/AlAs_{0.16}Sb_{0.84}$ SPS has a very low-lying valence band edge, providing excellent hole confinement. The $InAs/AlAs_{0.16}Sb_{0.84}$ superlattice possesses a lower energy valence band edge than InAs or any non-P-containing III/V alloys lattice-matched to InAs other than bulk $AlAs_{0.16}Sb_{0.84}$, which can be only doped n-type with Te. A low-lying valence band edge in the cladding layers is needed for hole confinement, which is one of the most critical requirements for MWIR laser structures.

Compared with prior art approaches for utilizing Si as an n-type dopant in MWIR laser structures (i.e., SD InAs/AlSb SPS lattice-matched to GaSb and SD AlAs/AlSb SPS lattice-matched to GaSb or InAs), the proposed $InAs/AlAs_{0.16}Sb_{0.84}$ SPS of the present invention has several advantages:

(1) The $InAs/AlAs_{0.16}Sb_{0.84}$ SPS is lattice-matched to InAs substrates. Accordingly, there are no restrictions to the thicknesses of the constituent layers, namely the layers of p-doped InAs 18 and p-doped $AlAs_{0.16}Sb_{0.84}$ 20 and the layers of n-doped InAs 26 and undoped $AlAs_{0.16}Sb_{0.84}$ 28. This feature of the present invention provides flexibility in designing transport and doping properties of the material. For example, the electron concentration can be varied simply by changing the n-doped InAs layer thickness to meet the requirements for different device applications (although doing so will also alter the energy gap of the SPS).

(2) InAs can be doped with Si to higher electron concentrations than AlAs, resulting in a larger dynamic range of obtainable electron concentrations than that of AlAs/AlSb SPS.

(3) The $InAs/AlAs_{0.16}Sb_{0.84}$ SPS has a very low-lying valence band edge, providing excellent hole confinement which is superior to that of InAs/AlSb SPS.

B. $In_xGa_yAl_{1-x-y}As$/AlSb Cladding Layers

An alternative embodiment to that described above is to use $In_xGa_yAl_{1-x-y}As$ in place of InAs and AlSb in place of $AlAs_{0.16}Sb_{0.84}$. Growth of this material via MBE technology is expected to be feasible. In the formula, x is greater than zero ($0<x\leq 1$), while y is less than one ($0\leq y<1$) and x plus y is less than or equal to one ($x+y\leq 1$). The formula is often alternately represented as In(Ga,Al)As or simply InGaAlAs. In the cases where y is equal to zero (y=0) or x plus y is equal to one (x+y=1), $In_xGa_yAl_{1-x-y}As$ corresponds to InAlAs and InGaAs, respectively.

FIG. 5 depicts this second embodiment of the superlattice-clad laser diode of the present invention. In this embodiment, an $In_xGa_yAl_{1-x-y}As$/AlSb superlattice laser structure 32 is formed on the p-doped InAs substrate 12. Note that either InAs or GaSb substrates can be used in the $In_xGa_yAl_{1-x-y}As$/AlSb superlattice laser structure 32. Also, doped n-type or p-type substrates can be used. The buffer layer 14 comprising $p^+$-doped InAs is formed on the InAs substrate 12, as is conventional in this art. In the case where the InAs substrate 12 is n-type, the buffer layer 14 would comprise $n^+$-doped InAs. Also, in the case where a p-type or n-type GaSb substrate is employed, the buffer layer 14 would comprise $p^+$-doped GaSb or $n^+$-doped GaSb, respectively. Next, the first superlattice cladding layer 16 (p-type) comprises alternating layers of p-doped $In_xGa_yAl_{1-x-y}As$ 34 (or p-$In_xGa_yAl_{1-x-y}As$) and p-doped AlSb (or p-AlSb) 36 and is formed on the buffer layer 14. Note that as an alternative to the alternating layers of p-doped $In_xGa_yAl_{1-x-y}As$ 34 and p-doped AlSb 36, the first superlattice cladding layer 16 (p-type) could comprise p-doped AlAsSb (or p-AlAsSb) bulk material. The active region 22 comprising undoped InAs is formed on the first superlattice cladding layer 16. The active region material is not limited to undoped InAs but may comprise alternative materials. In the case where a GaSb substrate is employed, the active region 22 may comprise $InAs_{0.9}Sb_{0.1}$. The second superlattice cladding layer 24 (n-type) comprises alternating layers of n-doped $In_xGa_yAl_{1-x-y}As$ (or n-$In_xGa_yAl_{1-x-y}As$) 38 and undoped AlSb 40 and is formed on the active region 22. The cap layer 30 comprising $n^+$-doped InAs is formed on top of the second superlattice cladding layer 24, completing the $In_xGa_yAl_{1-x-y}As$/AlSb superlattice laser structure 32.

In the case where an n-type substrate is employed, the cladding layer sequence needs to be reversed. The n-type superlattice cladding layer 24 would be formed on the buffer layer 14 and the p-type superlattice cladding layer 16 would be formed on the active region 22.

The layers of p-doped $In_xGa_yAl_{1-x-y}As$ 34 and p-doped AlSb 36 are doped with beryllium, while the layers of n-doped $In_xGa_yAl_{1-x-y}As$ 38 are doped with Si.

The proposed structure for the n-type cladding layer for MWIR laser structures can be grown on either InAs or GaSb substrates. The thickness ratio between the $In_xGa_yAl_{1-x-y}As$ wells (i.e., the layers of p-doped $In_xGa_yAl_{1-x-y}As$ 34 and the layers of n-doped $In_xGa_yAl_{1-x-y}As$ 38) and the AlSb barriers (i.e., the layers of p-doped AlSb 36 and the layers of undoped AlSb 40) are "free" parameters. The composition x is also a "free" parameter. These "free" parameters can be chosen to provide lattice-match, electrical, and optical confinement in the superlattice laser structure.

The effective carrier concentration can be varied by changing either the total thickness of the layers of n-doped InGaAlAs 38 or the Si doping level. Since the achievable Si doping level in InAs is relatively high (on the order of $5\times 10^{18}$ cm$^{-3}$), a wide range of electron concentrations are available for device design. Although the exact level of electron concentration is not available in the literature, a reasonable approximation can be made by borrowing the number for GaAs. For GaAs:Si grown by MBE, the maximum electron concentration is $\sim 5\times 10^{18}$ cm$^{-3}$ as given by A. Y. Cho et al, "Epitaxy of silicon doped gallium arsenide by molecular beam method", *Metallurgical Transactions*, Vol. 2, pp. 777–780 (March 1971). Therefore, for an InGaAlAs/AlSb SPS with $d_W$ (well width)/$d_B$ (barrier thickness)=1, a rough estimation gives a maximum electron concentration induced by Si doping of $2.5\times 10^{18}$ cm$^{-3}$.

As described above, FIG. 3 depicts the refractive indices of AlAs, AlSb, GaAs, GaSb, InAs, and InSb bulk materials.

For alloys consisting of these binary materials, it is reasonable to assume that their refractive indices, at energies well below the effective bandgap, are linear interpolations of the associated binaries. From FIG. 3, one can see that the $In_xGa_yAl_{1-x-y}As/AlSb$ has a smaller refractive index than any of the materials which are used as active regions for MWIR laser structures. Examples of such materials include InAs lattice-matched to InAs, $In_{0.72}Ga_{0.28}As_{0.73}Sb_{0.27}$ lattice-matched to InAs, or strained $In_xGa_{1-x}As_ySb_{1-y}$. Therefore, a waveguide can be readily made of $In_xGa_yAl_{1-x-y}As/AlSb$ material combinations.

The advantages of the proposed MWIR laser diode comprising the SD $In_xGa_yAl_{1-x-y}As:Si/AlSb$ SPS of the present invention are the following:

(1) the SD $In_xGa_yAl_{1-x-y}As:Si/AlSb$ SPS of the present invention can be grown lattice-matched to both InAs and GaSb substrates by an appropriate choice of x, y, and layer thickness.

(2) $In_xGa_yAl_{1-x-y}As$ can be doped to higher levels than AlAs by using Si; and (3) the SD $In_xGa_yAl_{1-x-y}As:Si/AlSb$ SPS of the present invention possesses a reasonably large refractive index and low-lying valence band edge, providing optical confinement and hole confinement, respectively.

In addition to these advantages, the SD $In_xGa_yAl_{1-x-y}As:Si/AlSb$ SPS of the present invention has a reasonably large bandgap which is convenient for certain optical pumping experiments.

The MWIR lasers fabricated in accordance with the present invention can be used for military and commercial applications including military countermeasures, highly-directional free-space optical communication systems, environmental monitoring, medical instruments, and automotive exhaust gas analysis.

Thus, there has been disclosed a laser diode for use at mid-wave infrared wavelengths, employing a novel superlattice cladding layer. It will be readily apparent to those skilled in this art that various changes and modifications of an obvious nature may be made, and all such changes and modifications are considered to fall within the scope of the invention, as defined by the appended claims.

What is claimed is:

1. A laser diode capable of operating at mid-wave infrared wavelengths, said laser diode including an active region having a first surface and a second surface and a first p-type cladding layer contacting said second surface and a second n-type cladding layer contacting said first surface, wherein said second n-type cladding layer comprises a plurality of alternating layers of either n-InAs and AlAsSb or n-InGaAlAs and AlSb.

2. The laser diode of claim 1 wherein said plurality of alternating layers in said second n-type cladding layer comprise n-InAs and AlAsSb and said layers of n-InAs are n-doped with silicon or wherein said plurality of alternating layers comprise n-InGaAlAs and AlSb and said layers of n-InGaAlAs are n-doped with silicon.

3. The laser diode of claim 1 wherein said layers of AlAsSb are given by the formula $AlAs_{0.16}Sb_{0.84}$ or said layers of n-InGaAlAs are given by the formula $n-In_xGa_yAl_{1-x-y}As$, where x is in the range $0<x\leq1$, y is in the range $0\leq y<1$, and $x+y\leq1$.

4. The laser diode of claim 1 wherein said plurality of alternating layers of n-InAs and AlAsSb are lattice-matched to an InAs substrate.

5. The laser diode of claim 1 wherein said plurality of alternating layers of n-InGaAlAs and AlSb are lattice-matched to a GaSb or InAs substrate.

6. The laser diode of claim 1 wherein said layers of AlAsSb or said layers of AlSb in said second n-type cladding layer are intentionally undoped.

7. The laser diode of claim 1 wherein said first p-type cladding layer comprises a plurality of alternating layers of either p-InAs and p-AlAsSb or p-InGaAlAs and p-AlSb.

8. The laser diode of claim 7 wherein said layers of p-InAs and p-AlAsSb or said layers of p-InGaAlAs and p-AlSb in said first p-type cladding layer are p-doped with beryllium.

9. The laser diode of claim 1 wherein said first p-type cladding layer comprises p-AlAsSb.

10. A short-period-superlattice comprising a plurality of alternating layers of either InAs and AlAsSb or InGaAlAs and AlSb lattice-matched to a GaSb or InAs substrate.

11. The short-period-superlattice of claim 10 wherein said layers of AlAsSb are given by the formula $AlAs_{0.16}Sb_{0.84}$ or said layers of InGaAlAs are given by the formula $In_xGa_yAl_{1-x-y}As$, where x is in the range $0<x\leq1$, y is in the range $0\leq y<1$, and $x+y\leq1$.

12. The short-period-superlattice of claim 10, wherein said short-period-superlattice is n-type and wherein said plurality of alternating layers comprise either n-InAs and AlAsSb or n-InGaAlAs and AlSb.

13. The short-period-superlattice of claim 12 wherein said plurality of alternating layers comprise n-InAs and AlAsSb and said layers of n-InAs are n-doped with silicon or wherein said plurality of alternating layers comprise n-InGaAlAs and AlSb and said layers of n-InGaAlAs are n-doped with silicon.

14. The short-period-superlattice of claim 12 wherein said layers of AlAsSb or said layers of AlSb are intentionally undoped.

15. The short-period-superlattice of claim 10, wherein said short-period-superlattice is p-type and wherein said plurality of alternating layers comprise either p-InAs and p-AlAsSb or p-InGaAlAs and p-AlSb.

16. The short-period-superlattice of claim 15 wherein said layers of p-InAs and p-AlAsSb or said layers of p-InGaAlAs and p-AlSb are p-doped with beryllium.

17. A method of making a laser diode that operates at mid-wave infrared wavelengths, said method comprising the steps of:

(a) providing an active region having a first surface and a second surface;

(b) providing a first p-type cladding layer contacting said second surface;

(c) providing a second n-type cladding layer contacting said first surface; and (d) providing said second n-type cladding layer with a plurality of alternating layers of either n-InAs and AlAsSb or n-InGaAlAs and AlSb.

18. The method of making a laser diode of claim 17, comprising providing said first p-type cladding layer with a plurality of alternating layers of either p-InAs and p-AlAsSb or p-InGaAlAs and p-AlSb.

* * * * *